United States Patent
Tsai et al.

(10) Patent No.: US 6,495,430 B1
(45) Date of Patent: Dec. 17, 2002

(54) PROCESS FOR FABRICATING SHARP CORNER-FREE SHALLOW TRENCH ISOLATION STRUCTURE

(75) Inventors: Wen-Bin Tsai, Tainan (TW); Chun-Pei Wu, Nantou Hsien (TW); Hui-Huang Chen, Hsin-Chu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 10/151,112

(22) Filed: May 21, 2002

(51) Int. Cl.⁷ .............................................. H01L 21/76
(52) U.S. Cl. ..................... 438/424; 438/425; 438/428; 438/430; 438/435; 438/438
(58) Field of Search ................................. 438/404, 410, 438/424, 425, 426, 428, 430, 435, 437, 438, 445

(56) References Cited

U.S. PATENT DOCUMENTS

| | | | |
|---|---|---|---|
| 5,246,537 A | * 9/1993 | Cooper et al. | 438/431 |
| 5,679,599 A | * 10/1997 | Mehta | 438/425 |
| 5,696,022 A | * 12/1997 | Jang | 438/439 |
| 5,719,086 A | * 2/1998 | Kim et al. | 438/443 |
| 5,891,787 A | * 4/1999 | Gardner et al. | 438/424 |
| 5,940,719 A | * 8/1999 | Jang et al. | 438/443 |
| 5,945,352 A | * 8/1999 | Chen et al. | 438/713 |
| 6,001,704 A | * 12/1999 | Cheng et al. | 438/410 |
| 6,020,230 A | * 2/2000 | Wu | 438/222 |
| 6,027,985 A | * 2/2000 | Jang et al. | 438/443 |
| 6,143,624 A | * 11/2000 | Kepler et al. | 438/433 |
| 6,228,747 B1 | * 5/2001 | Joyner | 438/436 |

* cited by examiner

Primary Examiner—Olik Chaudhuri
Assistant Examiner—Jack Chen
(74) Attorney, Agent, or Firm—Birch, Stewart, Kolasch & Birch, LLP

(57) ABSTRACT

A process for fabricating a sharp corner-free shallow trench isolation structure. First, a SiON layer and a mask layer are successively formed on a semiconductor substrate. The SiON layer and mask layer are patterned to form an opening, exposing the substrate region on which a shallow trench isolation region will be formed. Next, an oxide spacer is formed on sidewalls of the SiON layer and mask layer. A trench is formed in the semiconductor substrate using the spacer and mask layer as a mask. Next, a liner oxide layer is formed on the surface of the trench by thermal oxidation, such that the liner oxide layer near the SiON layer is in a bird's beak form. An isolating oxide layer is filled in the trench. Finally, the mask layer and SiON layer are removed. The present invention forms a short and thick bird's beak structure and rounded trench corner. Therefore, the thickness of the tunnel oxide is even and the tunnel oxide integrity remains. Thus, the electric current is not accumulated on the trench corner, and parasitic transistors and current leakage can be prevented.

20 Claims, 5 Drawing Sheets

PROCESS FOR FABRICATING SHARP CORNER-FREE SHALLOW TRENCH ISOLATION STRUCTURE

BACKGROUND OF THE INVENTION

1. Field of the Invention

The present invention relates to a process for fabricating a shallow trench isolation structure, and more particularly to a process for fabricating a sharp corner-free shallow trench isolation structure.

2. Description of the Prior Art

Process technology has evolved to submicron geometries, and shallow trench isolation (STI) has been gradually replacing conventional semiconductor device isolating methods such as, for example, local oxidation of silicon (LOCOS). STI provides several major advantages over LOCOS methods. For example, STI methods allow higher device density by decreasing the required width of the semiconductor device isolation structure. As yet another benefit, STI enhances surface planarity which, in turn, considerably improves critical dimension control during photolithography steps.

FIGS. 1a to 1c are cross-sections illustrating the process flow of fabricating an STI structure according to a conventional method. First, referring to FIG. 1a, a pad oxide layer 120 and a nitride layer 130 are successively formed on a semiconductor substrate 100, which are then patterned to form an opening 200.

Subsequently, referring to FIG. 1b, the semiconductor substrate 100 is etched to a predetermined depth using the patterned nitride layer 130 as a mask, thus forming a trench 210. In FIG. 1b, the corner defined by a vertically oriented sidewall 110 and the top surface of semiconductor substrate 100, which is called trench corner, is a sharp corner 300.

Subsequently, referring to FIG. 1c, an insulating material, such as silicon oxide, is filled into the trench 210 to form an insulating layer 420. Next, a densification step such as annealing is performed to densify the insulating layer 420. After this, the nitride layer 130 is removed. Next, a wet-etching process is performed to remove the pad oxide layer 120. Since this wet-etching process is isotropic, it also causes a lateral part of the oxide layer 420 to be etched away. Also, the stress induced by sharp corners 300 accelerates the etching rate of the insulating layer 420. As a result, a recess 460 is formed in the insulating layer 420 near the sharp corner 300.

When a dielectric layer such as tunnel oxide layer is formed during subsequent steps, the tunnel oxide layer is formed to be thinner near sharp corners 300. The reduction in the thickness of tunnel oxide layer results in poor tunnel oxide integrity. Also, this causes electric field reversion, thus forming parasitic transistors. A very high electric field is accumulated at the sharp corners 300, thus causing current leakage.

Many attempts have been made to fabricate an STI structure with a rounded corner in order to prevent the above-mentioned sharp corner effect. Joyner in U.S. Pat. No. 6,228,747 muses a disposable spacer of an organic material or low-temperature inorganic material to prevent the sharp corner effect. Chatterjee et al. use the LOCOS method to form a bird's beak structure to prevent the sharp corner effect. The process is very complicated (IEEE, 1996).

SUMMARY OF THE INVENTION

The object of the present invention is to solve the above-mentioned problems and to provide a process for fabricating a sharp corner-free shallow trench isolation structure. The corner formed from the sidewall and top surface of the silicon substrate is rounded. When a dielectric material such as tunnel oxide is formed afterwards on the active region, the corner thinning effect is prevented due to the rounded corner. The thickness of the tunnel oxide is even and the tunnel oxide integrity remains. Thus, the electric field is not accumulated on the trench corner, and parasitic transistors and current leakage can be prevented.

To achieve the above-mentioned object, the process for fabricating a sharp corner-free shallow trench isolation structure of the present invention includes the following steps. First, a SiON layer and a mask layer are successively formed on a semiconductor substrate. The SiON layer and mask layer are patterned to form an opening, exposing the substrate region on which a shallow trench isolation region will be formed. Next, an oxide spacer is formed on sidewalls of the SiON layer and mask layer. A trench is formed in the semiconductor substrate using the spacer and mask layer as a mask. Next, a liner oxide layer is formed on the surface of the trench by thermal oxidation, such that the liner oxide layer near the SiON layer is in a bird's beak form. An isolating oxide layer is filled in the trench. Finally, the mask layer and SiON layer are removed.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENTS

FIGS. 2a to 2e are cross-sections illustrating the process flow of fabricating the sharp corner-free shallow trench isolation structure according to a preferred embodiment of the present invention.

Figure 1A:
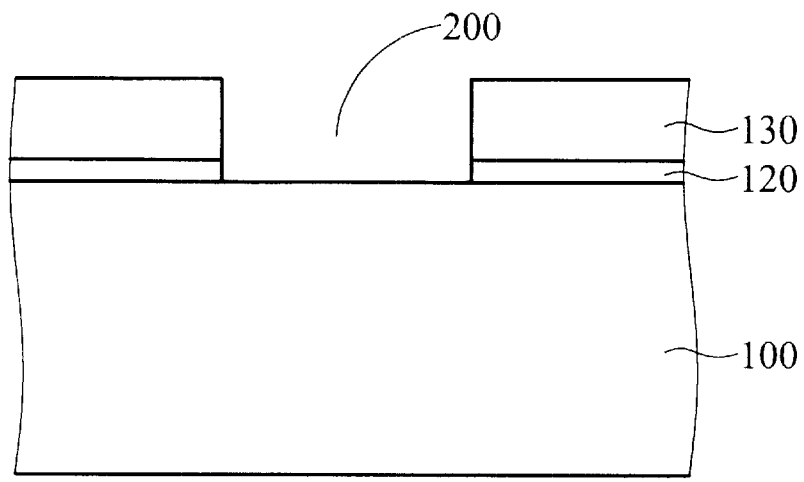
FIGS. 1a to 1c are cross-sections illustrating the process flow of fabricating an STI structure according to a conventional method.
Figure 1B:
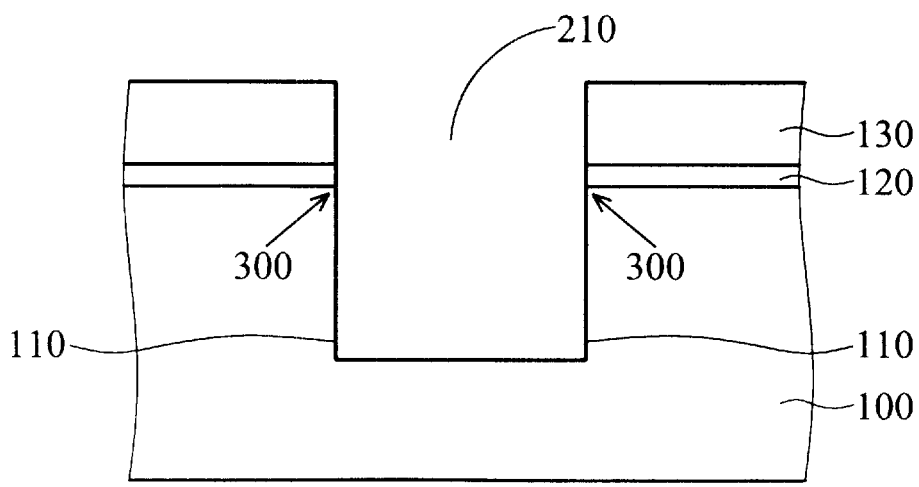
Figure 1C:
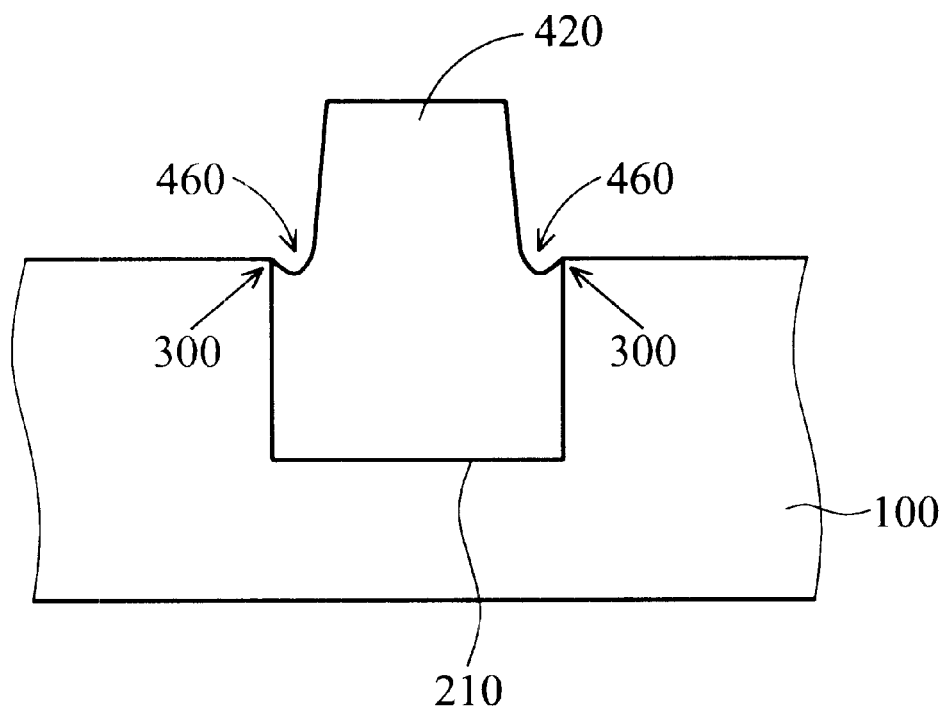
Figure 2A:
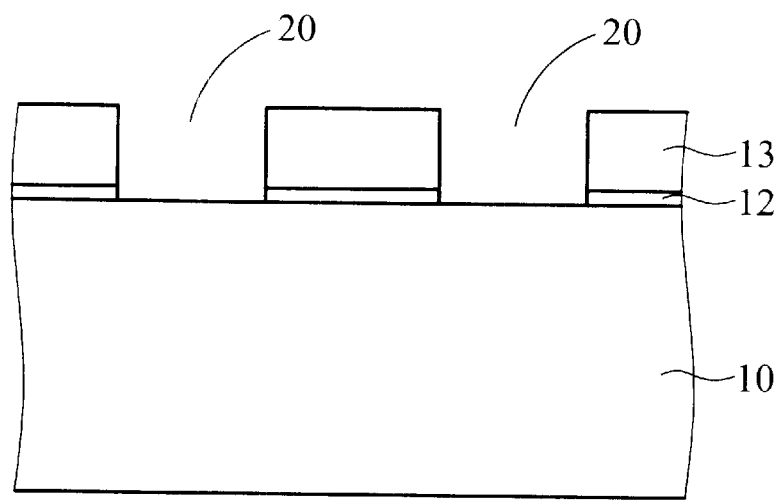
FIGS. 2a to 2e are cross-sections illustrating the process flow of fabricating the sharp corner-free shallow trench isolation structure according to a preferred embodiment of the present invention.

Referring to FIG. 2a, a SiON (silicon oxynitride) layer 12 and a mask layer 13 are successively formed on a semiconductor substrate 10, such as a silicon substrate. For example, the SiON 12 layer can be formed by reacting $SiH_4$, $N_2O$, and $N_2$ through a low pressure chemical vapor deposition (LPCVD) process or plasma-enhanced chemical vapor deposition (PECVD) process to a thickness of 150 Å to 250 Å. The mask layer 13 can be a silicon nitride layer formed by reacting dichlorosilane ($SiCl_2H_2$) with ammonia ($NH_3$) through a LPCVD process to a thickness about 1500 Å to 2500 Å.

Next, a photoresist layer (not shown) is formed on the nitride layer 13 to protect an active area on which devices will be formed later. The SiON layer 12 and the nitride layer 13 are anisotropically etched using the photoresist layer as a mask, forming an opening 20, exposing the substrate region on which a shallow trench isolation region will be formed. The photoresist layer is then removed.

Figure 2B:
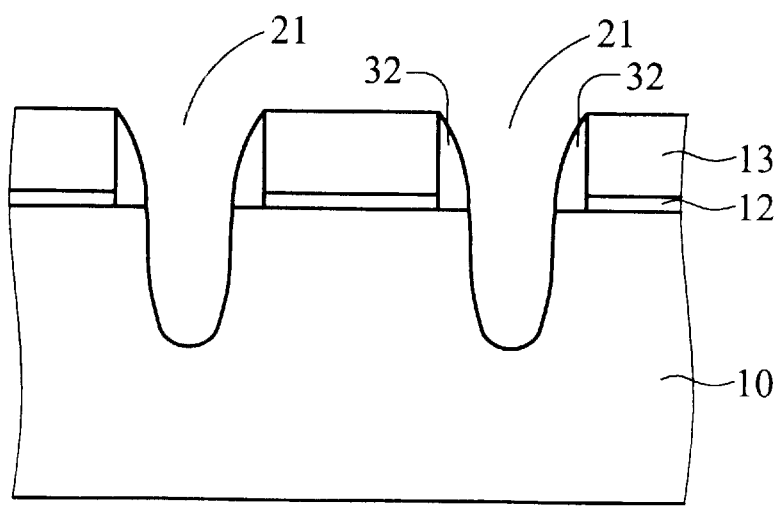

Referring to FIG. 2b, a conformal oxide layer (not shown) such as silicon oxide layer is deposited by CVD to a thickness of 400 Å to 500 Å to cover the entire surface of the semiconductor substrate 10. Next, the conformal oxide layer is anisotropically etched to form an oxide spacer 32 on sidewalls of the SiON layer 12 and mask layer 13. Next, the exposed semiconductor substrate 10 is etched using the oxide spacer 32 and mask layer 13 as a mask, forming a trench 21. The etching process employs a dry etching such as RIE (reactive ion etching) and the depth of the trench 21 is about 0.1 µm to 1.5 µm.

Figure 2C:
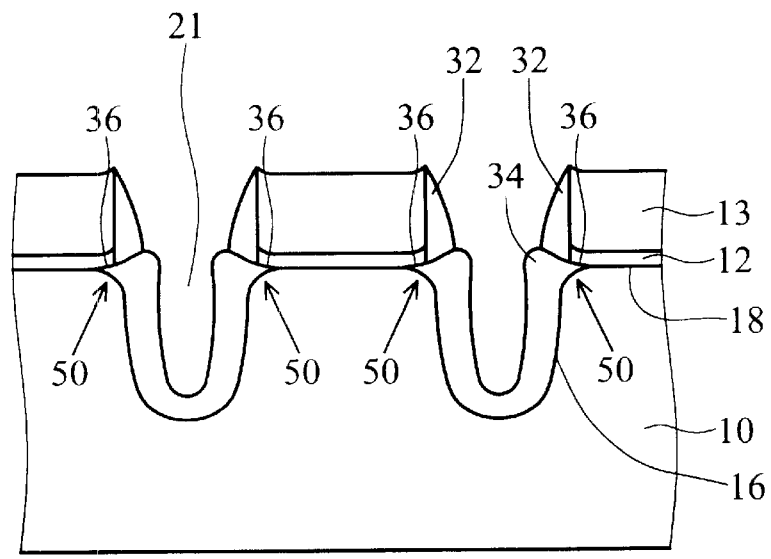

Referring to FIG. 2c, a liner oxide layer 34 is formed on the surface of the trench 21 by thermal oxidation. For example, the silicon wafer 10 is placed in a furnace at a temperature of 800° C. to 1100° C. and oxygen gas is introduced. The thickness of the liner oxide layer 34 can be 400 Å to 800 Å. When a silicon wafer is subjected to thermal oxidation, the oxidation not only occurs on the exposed region but also on the unexposed region. Therefore, oxygen diffuses through the SiON layer 12 so as to form a bird's beak structure 36 as in a local oxidation of silicon (LOCOS) process. In addition, during the thermal oxidation of the liner oxide layer 34, it encounters two different material, i.e., the SiON layer 12 and oxide spacer 32. Therefore, the oxidation toward the oxide spacer 32 (vertically) is faster than the oxidation toward the SiON layer 12 (laterally). Thus, the bird's beak structure is thick in vertical direction and short in lateral direction. Also, due to the bird's beak structure, the trench corner 50 formed from the verticallly oriented sidewall 16 and top surface 18 of the silicon wafer 10 becomes rounded.

Figure 2D:
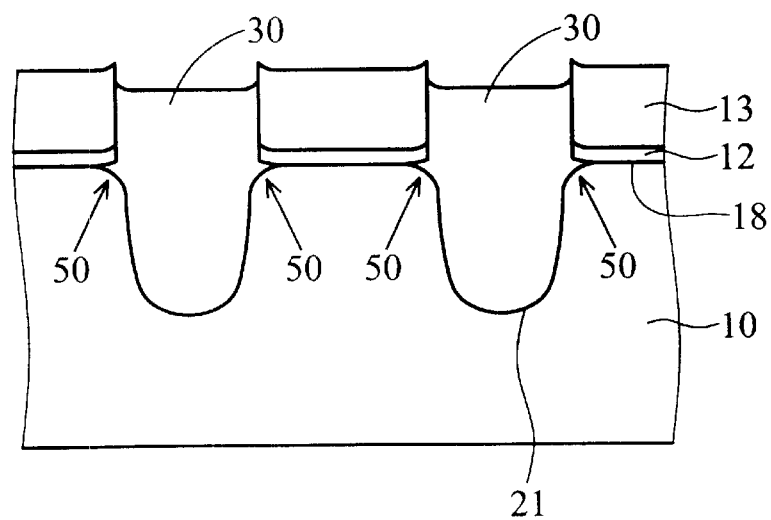
Figure 2E:
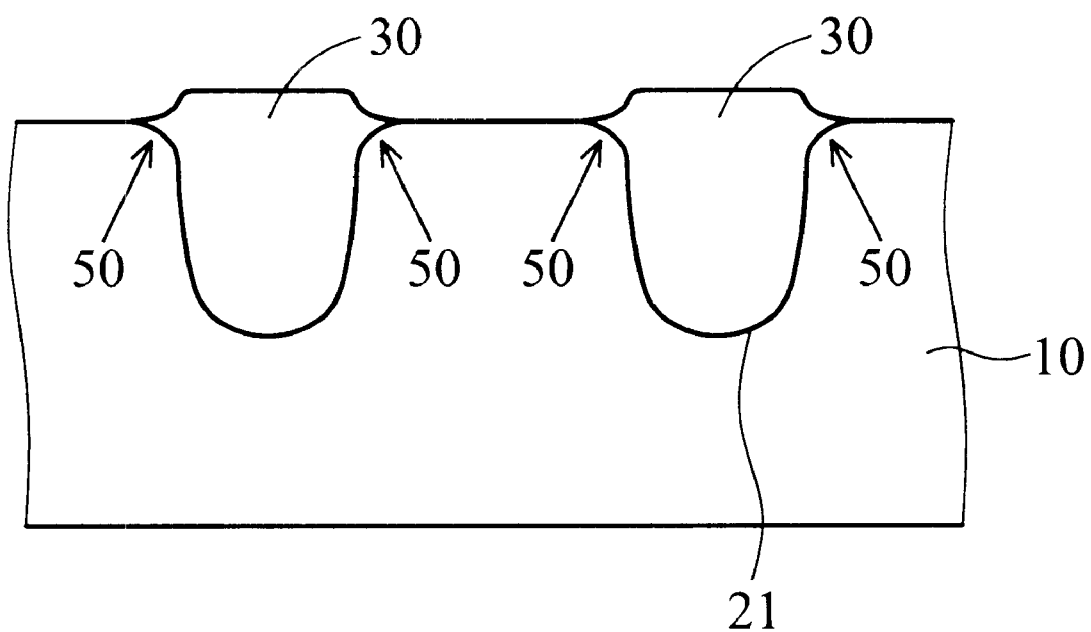

Referring to FIG. 2d, an isolating oxide layer is filled in the trench 21. For example, an oxide layer is deposited by high-density plasma chemical vapor deposition (HDPCVD) using oxygen ($O_2$) and silane ($SiH_4$) as a gas source over the entire surface of the semiconductor substrate 10, filling the HDP-oxide into the trench 21. Next, a planarization process, such as chemical mechanical polishing (CMP), is carried out to the HDP oxide until the mask layer 13 is exposed. In FIG. 2d, the oxide spacer 32, liner oxide layer 34, and the isolating oxide layer are integrated as an intergrated oxide layer 30 filled in the trench 21. Next, the mask layer 13 and SiON layer 12 are removed. Thus, the structure shown in FIG. 2e is formed, having the isolating material 30 filled in the trench 21, and the trench corner 50 is round.

Due to the rounded trench corner 50, when a dielectric material such as tunnel oxide is formed afterwards on the active region, the corner thinning effect is prevented. The thickness of the tunnel oxide is even and the tunnel oxide integrity remains. Thus, the electric current is not accumulated on the trench corner, and parasitic transistors and current leakage can be prevented. In conclusion, the present invention uses the SiON layer 12 as a pad layer and forms the oxide spacer 32 on the sidewalls of the SiON layer 12 and mask layer 13. Therefore, when thermal oxidation is performed to form the liner oxide layer 34 on the surface of the trench 21, the oxidation toward the oxide spacer 32 (vertically) is faster than the oxidation toward the SiON layer 12 (laterally).

Thus, the bird's beak structure is thick in vertical direction and short in lateral direction. The trench corner 50 formed from the verticallly oriented sidewall 16 and top surface 18 of the silicon wafer 10 becomes rounded. Therefore, when a dielectric material such as tunnel oxide is formed afterwards on the active region, the corner thinning effect is prevented due to the rounded trench corner. The thickness of the tunnel oxide is even and the tunnel oxide integrity remains. Thus, the electric current is not accumulated on the trench corner, and parasitic transistors and current leakage can be prevented.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process for fabricating a sharp corner-free shallow trench isolation structure, comprising the following steps:

forming successively a SION layer and a mask layer on a semiconductor substrate;

patterning the SiON layer and mask layer to form an opening, exposing the substrate region on which a shallow trench isolation region will be formed;

forming an oxide spacer on sidewalls of the SiON layer and mask layer;

forming a trench in the semiconductor substrate using the spacer and mask layer as mask;

forming a liner oxide layer on the surface of the trench, such that the liner oxide layer near the SiON layer is in a bird's beak form;

filling an isolating oxide layer in the trench; and removing the mask layer and SiON layer.

2. The process as claimed in claim 1, wherein the SiON layer has a thickness of 150 Å to 250 Å.

3. The process as claimed in claim 1, wherein the mask layer is silicon nitride.

4. The process as claimed in claim 3, wherein the mask layer has a thickness of 1500 Å to 2500 Å.

5. The process as claimed in claim 1, wherein the liner oxide layer has a thickness of 400 Å to 800 Å.

6. The process as claimed in claim 1, wherein the formation of the liner oxide layer comprises thermal oxidation.

7. The process as claimed in claim 6, wherein the thermal oxidation is conducted at 800° C. to 1100° C.

8. The process as claimed in claim 1, wherein the isolating oxide layer is formed by high density plasma (HDP) deposition.

9. The process as claimed in claim 1, further comprising, after the isolating oxide layer is filled, planarizing the isolating oxide layer until the mask layer is exposed.

10. The process as claimed in claim 9, wherein the planarization of the isolating oxide layer comprises chemical mechanical polishing (CMP).

11. The process as claimed in claim 1, wherein the step of forming an oxide spacer on sidewalls of the SiON layer and mask layer includes:

depositing a conformal oxide layer to cover the entire surface of the semiconductor substrate; and anisotropically etching the conformal oxide layer to form the oxide spacer.

12. A process for fabricating a sharp corner-free shallow trench isolation structure, comprising the following steps:

forming successively a SiON layer and a mask layer on a semiconductor substrate;

patterning the SION layer and mask layer to form an opening, exposing the substrate region on which a shallow trench isolation region will be formed;

depositing a conformal oxide layer to cover the entire surface of the semiconductor substrate;

anisotropically etching the conformal oxide layer to form an oxide spacer on sidewalls of the SiON layer and mask layer;

forming a trench in the semiconductor substrate using the spacer and mask layer as mask;

forming a liner oxide layer on the surface of the trench, such that the liner oxide layer near the SiON layer is in a bird's beak form;

filling an isolating oxide layer in the trench;

planarizing the isolating oxide layer until the mask layer is exposed; and removing the mask layer and SiON layer.

13. The process as claimed in claim 12, wherein the SiON layer has a thickness of 150 Å to 250 Å.

14. The process as claimed in claim 12, wherein the mask layer is silicon nitride.

15. The process as claimed in claim 14, wherein the mask layer has a thickness of 1500 Å to 2500 Å.

16. The process as claimed in claim 12, wherein the liner oxide layer has a thickness of 400 Å to 800 Å.

17. The process as claimed in claim 12, wherein the formation of the liner oxide layer comprises thermal oxidation.

18. The process as claimed in claim 17, wherein the thermal oxidation is conducted at 800° C. to 1100° C.

19. The process as claimed in claim 12, wherein the isolating oxide layer is formed by high density plasma (HDP) deposition.

20. The process as claimed in claim 12, wherein the planarization of the isolating oxide layer comprises chemical mechanical polishing (CMP).

* * * * *